United States Patent [19]
Wada et al.

[11] Patent Number: 6,020,619
[45] Date of Patent: Feb. 1, 2000

[54] RADIOACTIVE RAYS DETECTION SEMICONDUCTOR DEVICE

[75] Inventors: Takao Wada, Hitachinaka; Yuzo Ishibashi, Ibaraki-ken; Shigeru Ishii; Yoshikatsu Kuroda, both of Aichi-ken, all of Japan

[73] Assignees: Doryokuro Kakunenryo Kaihatsu Jigyodan; Mitsubishi Heavy Industries, Ltd., both of Tokyo, Japan

[21] Appl. No.: 09/078,262

[22] Filed: May 13, 1998

[30] Foreign Application Priority Data

May 13, 1997 [JP] Japan ..................... 9-122246

[51] Int. Cl.[7] .......................... H01L 27/14; H01L 31/00; H01L 31/115; G01J 1/24
[52] U.S. Cl. .............. 257/428; 250/370.07; 250/370.09; 257/429; 257/347; 438/57
[58] Field of Search .................... 250/370.02, 370.05, 250/370.07, 370.09; 257/426, 428, 429, 347; 438/56, 57

[56] References Cited

U.S. PATENT DOCUMENTS 4,213,045  7/1980  Fraass et al. ............... 250/370.07
5,339,066  8/1994  Marques et al. ................. 338/306

FOREIGN PATENT DOCUMENTS 1614764  12/1970  Germany.
4229315   3/1994  Germany.

OTHER PUBLICATIONS

M. Soubra, et al. (Apr. 1994), "Evaluation of a dual bias metal oxide–silicon semiconductor field effect transistor detector as radiation dosimeter", Medical Physics, vol. 21, No. 4, pp. 567–572.

*Primary Examiner*—Mahshid Saadat
*Assistant Examiner*—Allan R. Wilson
*Attorney, Agent, or Firm*—John P. White; Cooper & Dunham LLP

[57] ABSTRACT

The present invention intends to provide a radioactive rays detection semiconductor device comprises a substrate, an insulating layer formed on the substrate, p-type Si films formed on the insulating layer and equal in resistance value change rates due to temperature change and different in thickness so as to differ in the changes of the resistance values corresponding to the change of the total dose of the radioactive rays, an insulating film covering the p-type Si films, electrodes deposited in contact holes which are formed in the insulating film to reach both end of the p-type Si films, and Al wiring connecting the electrodes close to each other.

5 Claims, 2 Drawing Sheets

6,020,619

1

RADIOACTIVE RAYS DETECTION SEMICONDUCTOR DEVICE

BACKGROUND OF THE INVENTION

This invention relates to a radioactive rays detection semiconductor device for detecting radioactive rays, particularly to a radioactive rays detection semiconductor device for detecting a vast amount of a total dose of radioactive rays.

In the fields of space industry and the atomic power industry, a radioactive rays detection semiconductor device using a MOS transistor or the like is widely used to detect a vast amount (~$10^6$ Gy) of a total dose of radioactive rays. The total dose of radioactive rays is detected by detecting the change of the electric characteristics of the detection element when the element receives the radioactive rays.

FIG. 1 shows the structure of the conventional radioactive rays detection semiconductor device having a MOS transistor structure. In this device, two n-type diffusion films 2a and 2b respectively serving as source and drain are formed in a p-type semiconductor substrate 1, as shown in FIG. 1. On a channel region between the two n-type diffusion films 2a and 2b, a gate electrode 4 is formed on a gate electrode insulating layer 3 which is sandwiched by the channel region and the gate electrode. On these elements, an insulating film 7 is deposited and electrodes 5 and 6 are formed to contact with the two diffusion films 2a and 2b.

The electrodes 5 and 6 are applied with a positive voltage and the gate electrode is applied with a negative voltage. By applying the voltages in such a manner, a depletion layer is generated between the two n-type diffusion films 2a and 2b. When radioactive rays are incident on the depletion layer, the ionization occurs in the depletion layer to generate positive and negative charges. The positive and negative charges change a value of an electric current flowing between the electrodes 5 and 6. By detecting the change of the electric current value, the total dose of the radioactive rays incident in the element can be obtained.

In detecting the dose of the radioactive rays with use of the conventional radioactive rays detection semiconductor device having the above-mentioned structure, however, some problems will occur: the output of the detection element, i.e., the electric characteristics of the element will be also changed due to the change of the temperature of the element. Therefore, not only the change due to the radioactive rays but also that due to the temperature change of the element will be detected simultaneously, and thus the total dose of the radioactive rays cannot be detected without the error due to the temperature change.

Accordingly, with use of the conventional radioactive rays detection semiconductor device, the total dose of the radioactive rays cannot be detected with high precision in the environment such as space or atomic power industry facilities in which the ambient temperature or the intensity of the radioactive rays will change as time passes or area is increased/decreased.

The object of the present invention is thus to provide a semiconductor device capable of highly precise detection of the total dose of the radioactive rays without being affected by the temperature change in the environment in which the radioactive rays are detected or by the heat generated by the change of the intensity of the radioactive rays.

BRIEF SUMMARY OF THE INVENTION

The radioactive rays detection semiconductor device of the present invention comprises an insulating substrate member; a plurality of semiconductor films formed on the insulating substrate member, the semiconductor films having a conductivity type and being equal in resistance value change rates due to temperature change and different in thickness so as to differ in an amount of resistance value change corresponding to change of a total dose of radioactive rays, wherein the total dose of the radioactive rays is detected on the basis of a ratio of the resistance values of the semiconductor films.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the present invention will be described below with reference to the drawings.

Figure 1:
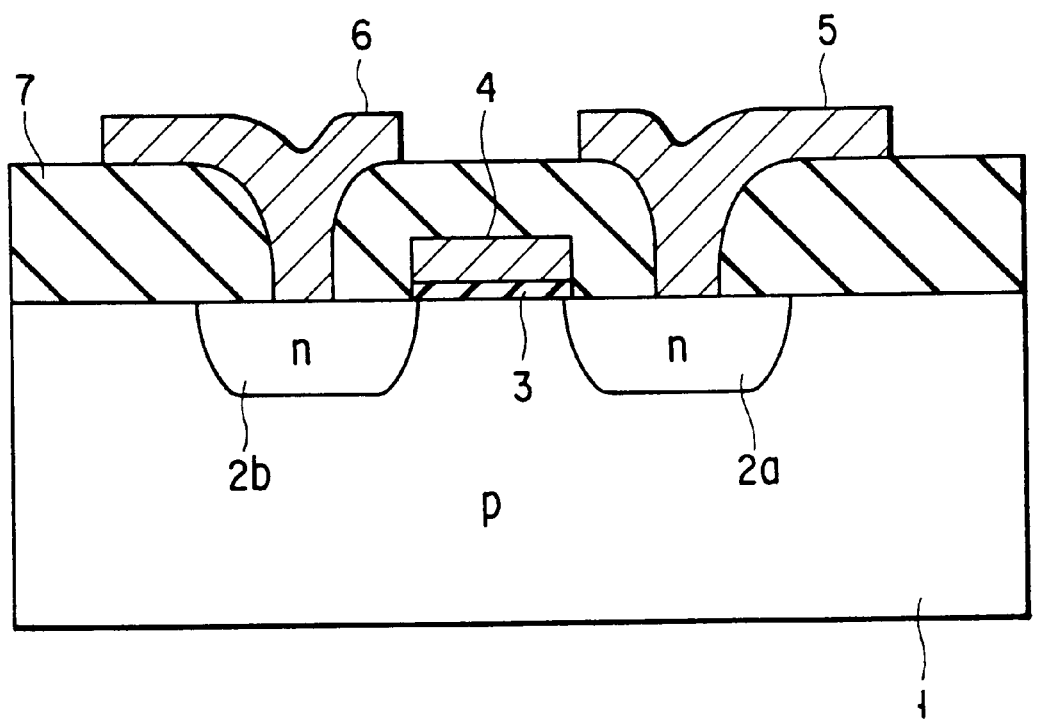
FIG. 1 is a sectional view of the. conventional radioactive rays detection semiconductor device.
Figure 2:
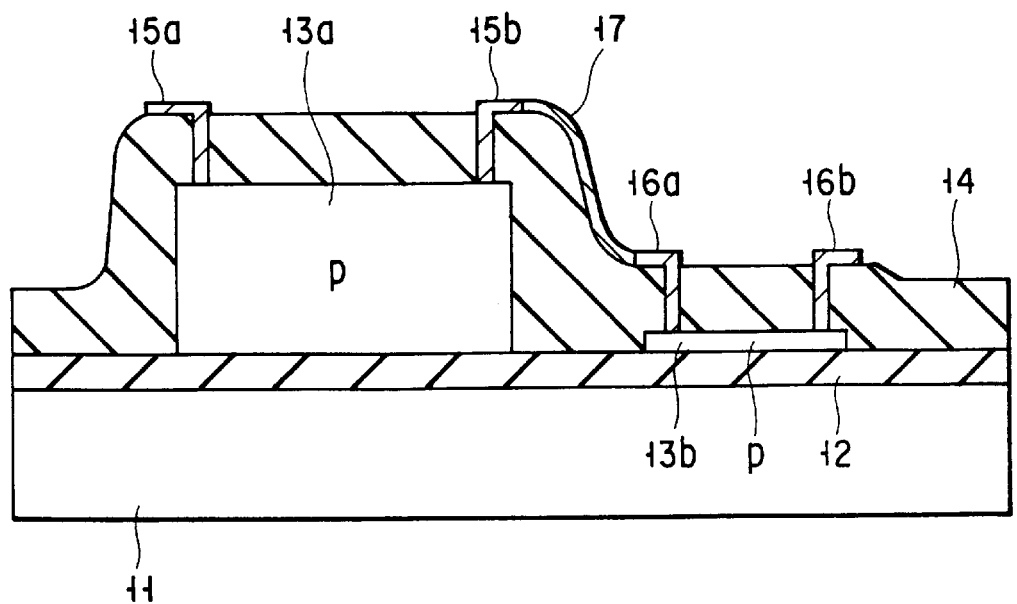
FIG. 2 is a sectional view of a radioactive rays detection semiconductor device according to an embodiment of the present invention.
Figure 3:
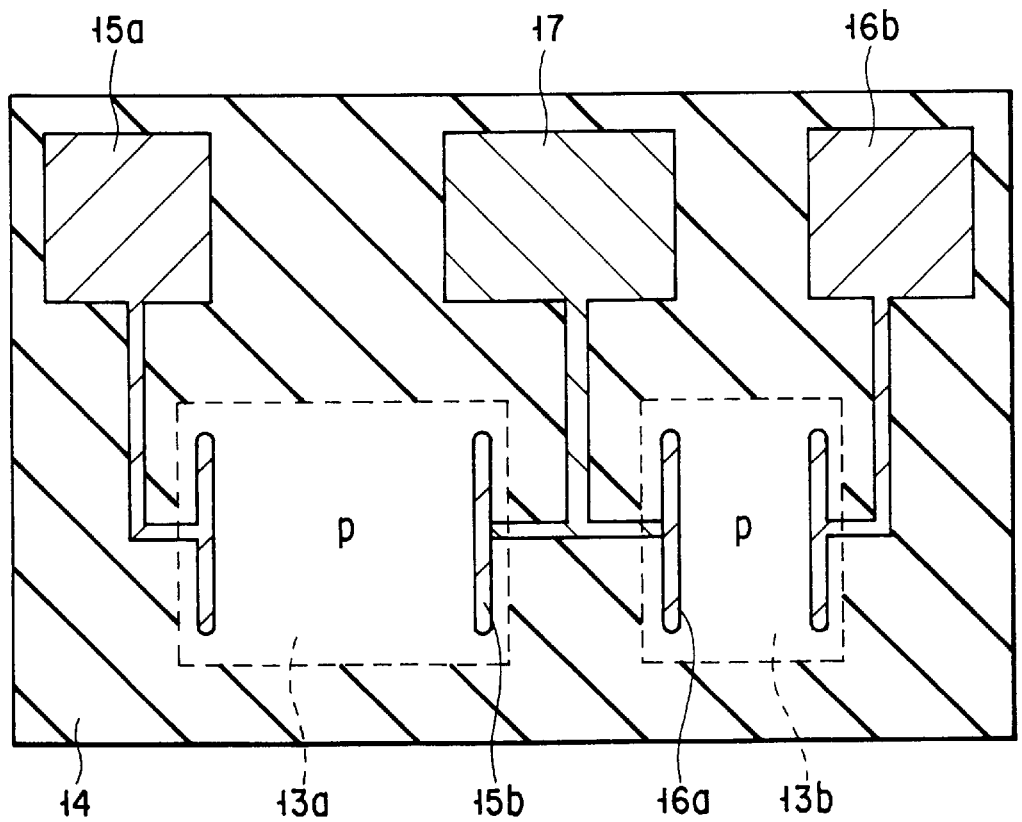
FIG. 3 is a plane view of the radioactive rays detection semiconductor device according to the embodiment of the present invention.

FIG. 2 shows a sectional view of a radioactive rays detection semiconductor device according to an embodiment of the present invention, and FIG. 3 shows the plane view thereof. As shown in FIG. 2, an insulating layer 12 is formed from $SiO_2$ on a substrate 11 of monocrystalline Si to form an insulating substrate. On the insulating layer 12, two p-type Si film 13a and 13b having equal carrier density and different from in thickness each other are formed. The two p-type Si film 13a and 13b are covered with an interlayer insulating film 14 which is formed from a material such as $SiO_2$, $Si_3N_4$, PSG or the like and deposited by the CVD technique.

Each of the p-type Si film 13a and 13b are provided at both ends thereof with two contact holes formed in the interlayer insulating film 14. By filling the contact holes with conductor such as Al, electrodes 15a and 15b connected to the p-type silicon film 13a and electrodes 16a and 16b connected to the p-type silicon film 13b are obtained. The electrodes 15b and 16a close to each other are connected to each other by wiring 17 formed from Al or the like such that the p-type Si film 13a and 13b are connected in series.

The radioactive rays detection semiconductor device having the above-mentioned structure may be formed to have a in the following size, for example:the p-type Si film 13a and 13b are formed to have a thickness around 5 $\mu$m and around 0.5 $\mu$m respectively, and to be spaced from each other by a distance of around 10 $\mu$m. The electrodes 15a and 15b provided to the p-type Si film 13a has a depth around 500 μm, and the electrodes 16a and 16b provided to the p-type Si film 13b has a depth around 500 μm.

As described above for example, the radioactive rays detection semiconductor device is designed remarkably compact in order to unify the temperature distribution of the detection device itself, in accordance with of a semiconductor device manufacturing technique such as the following methods (a) and (b):

(a) At first, a Si active layer of a p-type wafer which has inside an insulating layer formed from $SiO_2$ (e.g. a SOI [Silicon On Insulator] wafer) is etched to form two island-like p-type Si films. One of the island-like p-type Si films is selectively polished thereafter by the mechanical polishing or plasma polishing.

On the two island-like p-type Si films 13a and 13b formed in such a manner, the insulating film 14 is deposited by the CVD technique or the like. In the insulating film 14, two pairs of contact holes are then formed to reach both ends of each of the p-type Si film 13a and 13b. Thereafter, conductor such as Al is deposited thereon to fill the contact holes, and then patterned to form the four electrodes 15a, 15b, 16a, and 16b. The electrodes 15b and 16a which are close to each other are connected to each other by the wiring 17 formed of Al or the like.

(b) As a first step, a Si active layer of a p-type wafer which has inside an insulating layer formed from $SiO_2$ (e.g. a SOI [Silicon On Insulator] wafer) is etched to form the island-like p-type Si film 13a. Next, p-type Si having the same composition as that of the p-type Si film 13a is grown on the insulating layer 12 by the epitaxial growth. The grown p-type Si is etched to form another p-type Si film, i.e., a p-type Si film 13b. The process following thereto is the same as that of the process (a) described above.

The operation of the above-mentioned radioactive rays detection semiconductor device according to the embodiment of the present invention will be described below.

The electrode 15a is applied with a voltage from the outside, and the electrode 16b is grounded. The electrode 15b is the output terminal of this device. The output value is the difference between the potentials of the electrodes 15a and 16b, which is the divisional voltage of the voltage applied to the electrode 15a, obtained by using the p-type Si films 13a and 13b.

When the radioactive rays detection semiconductor device of the present invention absorbs radioactive rays, an amount of fixed positive charge which corresponds to the total dose of the radioactive rays is generated in the insulating layer 12 and the insulating film 14. The fixed positive charge increases the resistance value of the portion which contacts with the insulating layer 12 and the insulating film 14. In proportion with the increase of the total dose of the radioactive rays, the resistance values of the p-type Si film 13a and 13b will increase.

The rate of the changes of the resistance values of the p-type Si films 13a and 13b change in accordance with the thickness. The rate of the changes of the resistance value of the p-type Si film 13b having a thickness around 0.5 μm is larger than that of the p-type Si film 13b having a thickness around 5 μm. More specifically, when the total dose of the radioactive rays is $10^6$ Gy, the rate of the change of the resistance value of the p-type Si film 13b is 10 times larger than that of the p-type Si film 13a.

By virtue of this difference between the p-type Si films 13a and 13b in resistance value change rate, the total dose of the radioactive rays can be measured by detecting the output of the electrode 15b as the divisional voltage of the voltage applied to the electrode 15a by the p-type Si films 13a and 13b.

Also in the detection element of the present invention, the detection error may occur in detecting the output voltage due to the temperature change caused by the deviation of the resistance value change rate due to the temperature change of the p-type Si film 13a and 13b. The detection element of the present invention is, however, formed so compact in size as described before, and thus the p-type Si films 13a and 13b are set to be equal to each other in temperature.

Further, the p-type Si films 13a and 13b of the detection element of the present invention are formed in the same manufacturing step, and thus have equal carrier density. Therefore, the error in the resistance value change rate in the device of the present invention, which may be caused by the temperature change, can be suppressed at 100 PPM/° C. or less: a negligibly small amount in considering with the resistance value change rates of the p-type Si films 13a and 13b due to the change of the total dose of the radioactive rays.

As described above, the device of the present invention detects the total dose of the radioactive rays as the change of the ratio of the resistance values of two p-type Si films equal in resistance value change rate due to the temperature change and different in thickness from each other. Therefore, with use of the element of the present invention, the total dose of the radioactive rays can be detected with high precision with little influence of the error which may be caused by the temperature change of the detection element.

It is understood that the present invention is not limited to the embodiment described above. In the above mentioned embodiment, the two p-type Si films 13a and 13b different in thickness are used for the detection. The effect of the present invention can be also attained with use of two n-type Si films different in thickness, if the two n-type Si films have equal carrier density. The number of the formed Si films is not limited to two, but the same effect can be attained with use of more than two Si films. Further, the device can be formed in a size different from that defined in the embodiment.

As described above, the radioactive rays detection element according to the present invention comprises an insulating substrate, a plurality of semiconductors films which have the same conductivity and equal in resistance value change rate due to the temperature change and different in thickness such that the resistance value change rates corresponding to the radioactive rays amount differ from each other. On the basis of the ratio of the resistance values of the semiconductor films, the detection device of the present invention obtains the total dose of the radioactive rays. The detected value is thus not affected by the temperature change of the detection element or the heat generated by the change in the intensity of the radioactive rays. As a result, highly precise detection can be attained.

Accordingly, with use of the radioactive rays detection semiconductor device according to the present invention, the total dose of the radioactive rays can be detected with high precision even in the environment in which the ambient temperature or the intensity of the radioactive rays will change as time passes or area is increased/decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A radioactive rays detection semiconductor device comprising:

an insulating substrate member;

a plurality of semiconductor films formed on the insulating substrate member, the semiconductor films having one conductivity type and being equal in resistance value change rates due to temperature change and different in thickness so as to differ in an amount of resistance value change corresponding to change of a total dose of radioactive rays; and means for detecting the total dose of the radioactive rays on the basis of a ratio of the resistance values of the semiconductor films.

2. A radioactive rays detection semiconductor device according to claim 1, wherein the plurality of semiconductor films having the one conductivity type are two semiconductor films having one conductivity.

3. A radioactive rays detection semiconductor device according to claim 1, wherein the plurality of semiconductor films having the one conductivity type are formed from p-type Si.

4. A radioactive rays detection semiconductor device according to claim 1, wherein the insulating substrate member has a member formed of $SiO_2$ on Si.

5. A radioactive rays detection semiconductor device comprising:

a substrate;

an insulating layer formed on the substrate;

p-type Si films formed on the insulating layer and equal in resistance value change rates due to temperature change and different in thickness so as to differ in the changes of the resistance values corresponding to the change of the total dose of the radioactive rays;

an insulating film covering the p-type Si films;

electrodes deposited in contact holes which are formed in the insulating film to reach both end of the p-type Si films; and Al wiring connecting the electrodes close to each other.

* * * * *